United States Patent
Brandl et al.

(10) Patent No.: US 9,520,539 B2
(45) Date of Patent: Dec. 13, 2016

(54) OPTOELECTRONIC COMPONENT AND METHOD FOR THE PRODUCTION THEREOF

(71) Applicant: OSRAM Opto Semiconductors GmbH, Regensburg (DE)

(72) Inventors: Martin Brandl, Kelheim (DE); Michael Zitzlsperger, Regensburg (DE)

(73) Assignee: OSRAM Opto Semiconductor GmbH (DE)

( * ) Notice: Subject to any disclaimer, the term of this patent is extended or adjusted under 35 U.S.C. 154(b) by 0 days.

(21) Appl. No.: 14/784,879

(22) PCT Filed: Apr. 4, 2014

(86) PCT No.: PCT/EP2014/056809
§ 371 (c)(1),
(2) Date: Oct. 15, 2015

(87) PCT Pub. No.: WO2014/170141
PCT Pub. Date: Oct. 23, 2014

(65) Prior Publication Data
US 2016/0064618 A1    Mar. 3, 2016

(30) Foreign Application Priority Data
Apr. 17, 2013   (DE) .................. 10 2013 206 963

(51) Int. Cl.
*H01L 33/00*    (2010.01)
*H01L 33/48*    (2010.01)
*H01L 33/62*    (2010.01)
*H01L 33/56*    (2010.01)

(52) U.S. Cl.
CPC ............. *H01L 33/483* (2013.01); *H01L 33/56* (2013.01); *H01L 33/62* (2013.01); *H01L 2924/0002* (2013.01); *H01L 2933/005* (2013.01); *H01L 2933/0033* (2013.01); *H01L 2933/0066* (2013.01)

(58) Field of Classification Search
CPC ..................................... H01L 33/483
USPC ........................................... 257/99
See application file for complete search history.

(56) References Cited

U.S. PATENT DOCUMENTS

| | | |
|---|---|---|
| 2005/0151149 A1 | 7/2005 | Chia et al. |
| 2008/0121921 A1 | 5/2008 | Loh et al. |
| 2011/0002587 A1 | 1/2011 | Bogner et al. |
| 2011/0121336 A1 | 5/2011 | Bogner et al. |
| 2011/0317100 A1 | 12/2011 | Yu et al. |

(Continued)

FOREIGN PATENT DOCUMENTS

| | | |
|---|---|---|
| DE | 10 2007 033 057 A1 | 1/2008 |
| DE | 10 2007 001 706 A1 | 7/2008 |

(Continued)

OTHER PUBLICATIONS

Notice of Reasons for Rejection dated Oct. 4, 2016, of corresponding Japanese Application No. 2016-508078 in English.

*Primary Examiner* — Anthony Ho
(74) *Attorney, Agent, or Firm* — DLA Piper LLP (US)

(57) ABSTRACT

An optoelectronic component includes a plastics housing, wherein a first leadframe section is embedded into the plastics housing, a chip landing face and a soldering contact face of the first leadframe section are at least partly not covered by the plastics housing, the soldering contact face has a groove, and the groove is not covered by the material of the plastics housing.

16 Claims, 2 Drawing Sheets

(56) References Cited

U.S. PATENT DOCUMENTS

2012/0025260 A1    2/2012   Oonakahara et al.
2012/0074451 A1    3/2012   Lin

FOREIGN PATENT DOCUMENTS

| DE | 10 2007 060 206 A1 | 6/2009 |
|----|--------------------|--------|
| JP | 7-156581 | 6/1995 |
| JP | 2004-146853 | 5/2004 |
| JP | 2006-191143 | 7/2006 |
| JP | 2006-222382 | 8/2006 |
| JP | 2012-033724 | 2/2012 |
| JP | 2012-054280 | 3/2012 |
| JP | 2012-182296 | 9/2012 |
| JP | 5083472 | 11/2012 |

OPTOELECTRONIC COMPONENT AND METHOD FOR THE PRODUCTION THEREOF

TECHNICAL FIELD

This disclosure relates to an optoelectronic component and a method of producing an optoelectronic component.

DE 10 2013 206 963.4, which expressly forms part of this disclosure, likewise describes an optoelectronic component and a method of producing an optoelectronic component.

BACKGROUND

Optoelectronic components comprising premolded plastics housings (premold housings) are known. Such plastics housings often have a cavity filled with a potting material that serves for mechanical protection and can bring about a diffuse light scattering and/or a wavelength conversion. During production of such optoelectronic components, the premolded plastics housing is subjected to mechanical loading that can cause gaps to be formed between the material of the plastics housing and leadframe sections embedded into the plastics housing. This gives rise to impermeabilities which, when the cavity is filled with the potting material, can result in the potting material creeping onto a soldering side of the optoelectronic component. On the soldering side of the optoelectronic component, the potting material can contaminate soldering faces and thereby make the optoelectronic component unusable.

It could therefore be helpful to provide an optoelectronic component comprising a plastics housing.

SUMMARY

We provide an optoelectronic component including a plastics housing, wherein a first leadframe section is embedded into the plastics housing, a chip landing face and a soldering contact face of the first leadframe section are at least partly not covered by the plastics housing, the soldering contact face has a groove, and the groove is not covered by the material of the plastics housing.

We further provide a method of producing an optoelectronic component including providing a first leadframe section having a chip landing face and a soldering contact face, which has a groove; and embedding the first leadframe section into a plastics housing such that the chip landing face and the soldering contact face are at least partly not covered by the plastics housing, wherein the groove is not covered by the material of the plastics housing.

We yet further provide an optoelectronic component including a plastics housing, wherein a first leadframe section is embedded into the plastics housing, a chip landing face and a soldering contact face of the first leadframe section are at least partly not covered by the plastics housing, the soldering contact face has a groove, the groove extends circumferentially around a central region of the soldering contact face at least in sections, and the groove is not covered by the material of the plastics housing.

LIST OF REFERENCE SIGNS

Figure 1:
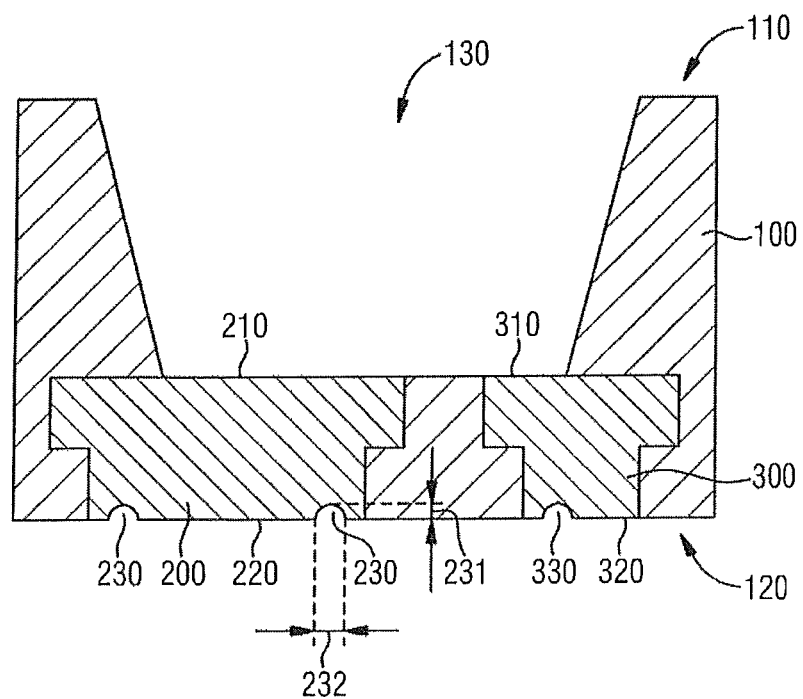
FIG. 1 shows a section through a plastics housing of an optoelectronic component in a first processing state.

10 Optoelectronic component
100 Plastics housing
110 Top side
120 Underside
130 Cavity
140 Gap
200 First leadframe section
210 Chip landing face
220 Soldering contact face
221 Edge region
222 Central region
230 First groove
231 Depth
232 Width
300 Second leadframe section
310 Upper face
320 Lower face
330 Second groove
400 Optoelectronic semiconductor chip
410 First surface
420 Second surface
430 Bond wire
500 Potting material

DETAILED DESCRIPTION

The optoelectronic component comprises a plastics housing into which a first leadframe section is embedded. A chip landing face and a soldering contact face of the first leadframe section are at least partly not covered by the plastics housing. The soldering contact face has a groove. The groove is not covered by the material of the plastics housing. Advantageously, the soldering contact face of the first leadframe section in this optoelectronic component is protected against contamination by the groove. A potting material creeping through a gap between the material of the plastics housing and the first leadframe section cannot advance via the groove onto the soldering contact face of the first leadframe section and, as a result, cannot completely wet the soldering contact face. As a result, the soldering contact face advantageously remains accessible and can be wetted with solder during soldering of the optoelectronic component.

The groove may be arranged in an edge region of the soldering contact face. Advantageously, as a result, a possible contamination of the soldering contact face cannot advance beyond the edge region of the soldering contact face onto the soldering contact face.

The groove may extend circumferentially around a central region of the soldering contact face at least in sections. Advantageously, the central region of the soldering contact face is thereby protected against contamination.

The groove may have a depth of 10 µm to 1 mm, preferably a depth of 50 µm to 200 µm. The groove can have a depth of 100 µm and a width of 150 µm, for example. A groove having these dimensions advantageously ensures that a capillary force between the soldering contact face and a support on which the soldering contact face bears is interrupted in the region of the groove. As a result, a contaminating material cannot advance beyond the groove onto the soldering contact face.

An optoelectronic semiconductor chip may be arranged on the chip landing face. Advantageously, the first leadframe section can lead an electrical contact of the optoelectronic semiconductor chip to the soldering contact face. As a result, the optoelectronic semiconductor chip of this optoelectronic component can electrically contact the soldering contact face via a soldering connection.

The plastics housing may have a cavity adjoining the chip landing face. In this case, a potting material is arranged in the cavity. Advantageously, the potting material can be arranged in the cavity of the plastics housing without there being any need here to fear contamination of the soldering contact face with the potting material.

The groove may be provided to prevent wetting of the central region by the potting material. Potting material possibly creeping through a gap between the material of the plastics housing and the first leadframe section cannot advance via the groove as far as the central region of the soldering contact face of the first leadframe section and, as a result, cannot wet the central region. As a result, the central region of the soldering contact face advantageously remains accessible and can be wetted with solder during soldering of the optoelectronic component.

The potting material may comprise silicone. Advantageously, the silicone can bring about a mechanical protection of an optoelectronic semiconductor chip of the optoelectronic component. The potting material can also comprise light scattering particles and/or converter particles. In this case, the potting material of the optoelectronic component advantageously brings about a diffuse light scattering and/or a wavelength conversion.

A second leadframe section may be embedded into the plastics housing. In this case, the second leadframe section has an upper face and a lower face which are at least partly not covered by the plastics housing. Advantageously, the second leadframe section embedded into the plastics housing can provide a second soldering contact at an outer side of the optoelectronic component. The second soldering contact can, for example, electrically contact an optoelectronic semiconductor chip of the optoelectronic component.

The lower face of the second leadframe section may have a further groove. Advantageously, as a result, the lower face of the second leadframe section is also protected against possible contamination with a potting material.

The method of producing an optoelectronic component comprises steps providing a first leadframe section having a chip landing face and having a soldering contact face, which has a groove, and embedding the first leadframe section into a plastics housing such that the chip landing face and the soldering contact face are at least partly not covered by the plastics housing. In this case, the groove is not covered by the material of the plastics housing. Advantageously, an optoelectronic component in which a soldering contact face of a first leadframe section can electrically contact the optoelectronic component is obtainable by this method. In this case, the soldering contact face is advantageously protected against contamination by the groove. A good wettability of the soldering contact face with solder is ensured as a result.

The method may comprise a further step of arranging an optoelectronic semiconductor chip on the chip landing face of the first leadframe section. Advantageously, the optoelectronic semiconductor chip positioned on the chip landing face of the first leadframe section can be electrically contacted via the soldering contact face of the first leadframe section.

The method may comprise a further step of arranging a potting material in a cavity of the plastics housing, the cavity adjoining the chip landing face. This advantageously ensures that the potting material arranged in the cavity does not contaminate the soldering contact face of the first leadframe section. A part of the potting material that creeps through a gap possibly present between the material of the plastics housing and the first leadframe section embedded into the plastics housing cannot advance beyond the groove arranged in the soldering contact face onto the soldering contact face.

The groove may prevent a central region of the soldering contact face around which central region the groove is embodied in a manner extending circumferentially at least in sections, from being wetted by the potting material. Potting material that possibly creeps through a gap between the material of the plastics housing and the first leadframe section cannot advance via the groove as far as the central region of the soldering contact face of the first leadframe section and, as a result, cannot wet the central region. As a result, the central region of the soldering contact face advantageously remains accessible and can be wetted with solder during soldering of the optoelectronic component.

The above-described properties, features and advantages and the way in which they are achieved will become clearer and more clearly understood in association with the following description of examples which are explained in greater detail in association with the drawings.

Figure 2:
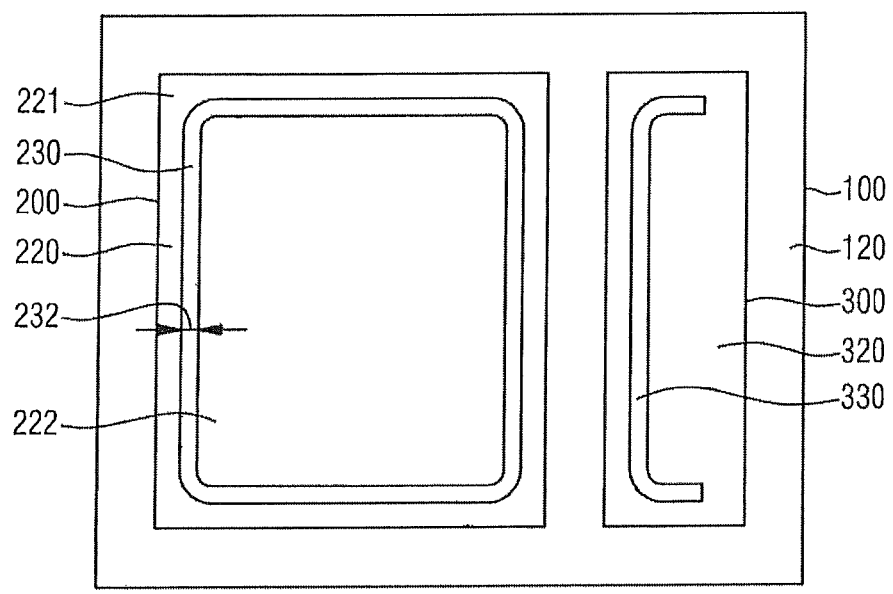
FIG. 2 shows a plan view of a soldering side of the plastics housing.

FIG. 1 shows a schematic sectional illustration of a plastics housing 100. The plastics housing 100 has a top side 110 and an underside 120 opposite the top side 110. FIG. 2 shows a schematic plan view of the underside 120 of the plastics housing 100. The plastics housing 100 can serve as a housing for an optoelectronic component, for example, a light emitting diode component.

The plastics housing 100 can also be designated as a premold housing or a premolded housing. The plastics housing 100 can be produced, for example, by an injection molding method or transfer molding method (mold method). The plastics housing 100 comprises a plastics material.

A cavity 130 is formed at the top side 110 of the plastics housing 100. The cavity 130 is open to the top side 110 of the plastics housing 100. Laterally, the cavity 130 of the plastics housing 100 is delimited by a circumferential edge. In the example illustrated, the cavity 130 has a diameter widening conically toward the top side 110. However, the cavity 130 could also be embodied differently. In a lateral direction perpendicular to the sectional illustration in FIG. 1, the cavity 130 can be in the shape of a circular disk, for example.

A first leadframe section 200 and a second leadframe section 300 are embedded into the material of the plastics housing 100. The first leadframe section 200 and the second leadframe section 300 comprise an electrically conductive material. By way of example, the first leadframe section 200 and the second leadframe section 300 can comprise a metal. The first leadframe section 200 and the second leadframe section 300 can jointly also be designated as a leadframe. The first leadframe section 200 and the second leadframe section 300 can be produced by etching or by stamping, for example.

The first leadframe section 200 has a chip landing face 210 and a soldering contact face 220 opposite the chip landing face 210. The second leadframe section 300 has an upper face 310 and a lower face 320 opposite the upper face 310. The chip landing face 210 and the soldering contact face 220 of the first leadframe section 200 and also the upper face 310 and the lower face 320 of the second leadframe section 300 are in each case at least not completely covered by the material of the plastics housing 100. In the example illustrated, the chip landing face 210 and the upper face 310 are partly exposed. The soldering contact face 220 and the lower face 320 are completely exposed. The soldering contact face 220 of the first leadframe section 200 and the lower face 320 of the second leadframe section 300 are oriented toward the underside 120 of the plastics housing 100 and are flush with the underside 120 of the plastics housing 100. The chip landing face 210 of the first leadframe section 200 and the upper face 310 of the second leadframe section 300 are oriented toward the cavity 130 of the plastics housing 100 and jointly form part of the bottom face of the cavity 130.

Preferably, the first leadframe section 200 and the second leadframe section 300 have already been embedded into the material of the plastics housing 100 during the protection of the plastics housing 100. This may have been carried out, for example, by the first leadframe section 200 and the second leadframe section 300 being encapsulated by molding with the material of the plastics housing 100 in a molding process.

The soldering contact face 220 of the first leadframe section 200 has a first groove 230. The first groove 230 is arranged in an edge region 221 of the soldering contact face 220 and encloses a central region 222 of the soldering contact face 220 circumferentially in a ring-shaped fashion. The first groove 230, proceeding from the surface of the soldering contact face 220, has a depth 231. Perpendicular to the longitudinal direction of the first groove 230, the latter has a width 232. The depth 231 is preferably 10 µm to 1 mm, particularly preferably 50 µm to 200 µm. Especially preferably, the depth 231 of the first groove 230 is approximately 100 µm. The width 232 of the first groove 230 is preferably likewise 10 µm to 1 mm, particularly preferably 75 µm to 300 µm. Especially preferably, the width 232 of the first groove 230 is approximately 150 µm. The first groove 230 can be spaced apart from the outer edge of the soldering contact face 220, for example, by a distance corresponding to one to ten times the width 232 of the first groove 230. The first groove 230 may have been introduced into the soldering contact face 220, for example, by etching, embossing or a laser. That part of the soldering contact face 220 of the first leadframe section 200 which has the first groove 230 is not covered by the material of the plastics housing 100 such that no material of the plastics housing 100 is arranged in the first groove 230 either. The central region 222 of the soldering contact face 220 is also not covered by the material of the plastics housing 100.

The lower face 320 of the second leadframe section 300 has a second groove 330. The second groove 330 is arranged in an edge region of the lower face 320, but only partly encloses a central region of the lower face 320. In the example illustrated, the second groove 330 extends around only half a circumference of the lower face 320 and is arranged at that side of the lower face 320 of the second leadframe section 300 which faces the chip landing face 210 of the first leadframe section 200. The dimensions of the second groove 330 preferably approximately correspond to those of the first groove 230. The second groove 330 may have been created using the same method as that for the first groove 230. That part of the lower face 320 of the second leadframe section 300 which has the second groove 330 is not covered by the material of the plastics housing 100 such that no material of the plastics housing 100 is arranged in the second groove 330 either. The central region of the lower face 320 is also not covered by the material of the plastics housing 100.

It is also possible for the first groove 230 to be an incompletely closed ring. The first groove 230 then extends around the central region 222 of the soldering contact face 220 only in a limited angular section of, for example, half a circumference of the soldering contact face 220. It is likewise possible to form the second groove 330 in a manner extending completely circumferentially around a central region of the lower face 320. Provision of the second groove 330 can also be completely dispensed with, under certain circumstances.

Figure 3:
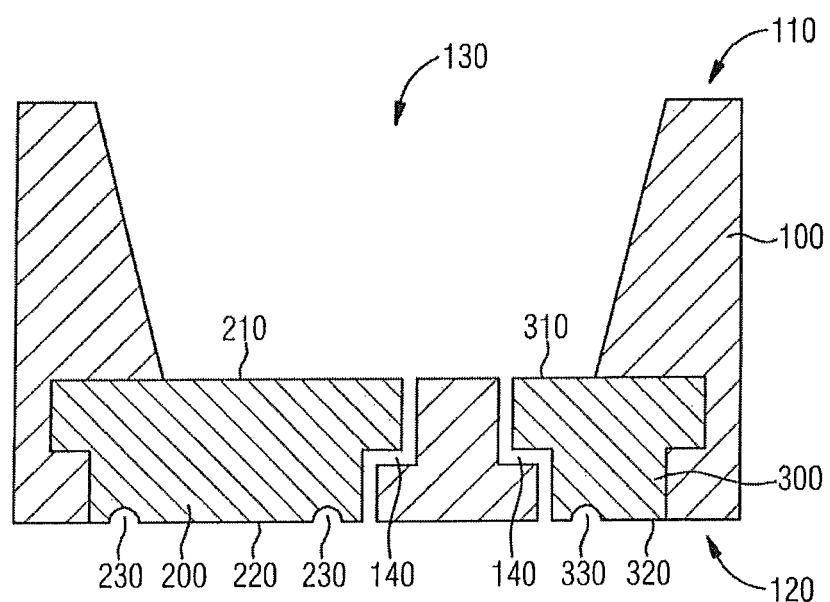
FIG. 3 shows a section through the plastics housing of the optoelectronic component in a second processing state.

FIG. 3 shows a schematic sectional illustration of the plastics housing 100 in a processing state temporally succeeding the illustration in FIG. 1. Between the processing states in FIGS. 1 and 3, the plastics housing 100 has been subjected to mechanical loading. The mechanical loading may have occurred, for example, during a deflash process, an electrolytic process or during deburring.

As a result of the mechanical stress exerted on the plastics housing 100, gaps 140 have arisen between the material of the plastics housing 100 and the first leadframe section 200 embedded into the plastics housing 100, and also between the material of the plastics housing 100 and the second leadframe section 300 embedded into the plastics housing 100. The gaps 140 extend from the cavity 130 of the plastics housing 100 along the first leadframe section 200 and the second leadframe section 300 as far as the underside 120 of the plastics housing 100. The gaps 140 are merely illustrated schematically in FIG. 3 and need not form in every case and need not form along the entire circumference of the first leadframe section 200 and the second leadframe section 300. During the processing of the plastics housing 100, however, there is in principle the risk of formation of the gaps 140.

Figure 4:
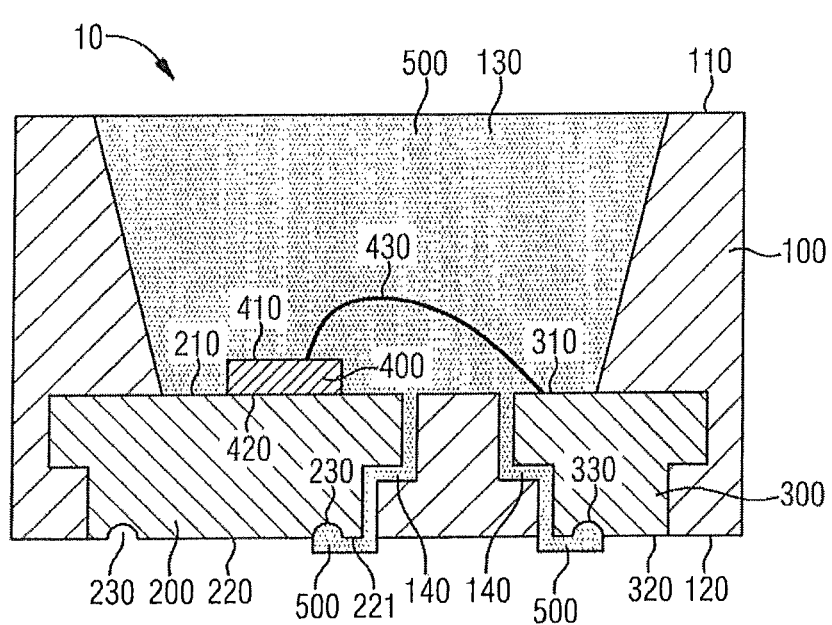
FIG. 4 shows a sectional view of the optoelectronic component in a finished processing state.

FIG. 4 shows a further schematic sectional illustration of the plastics housing 100 in a processing state temporally succeeding the illustration in FIG. 3. An optoelectronic component 10 comprising the plastics housing 100 has been formed by further processing steps. The optoelectronic component 10 can be a light emitting diode component, for example.

In a first processing step temporally succeeding the illustration in FIG. 3, an optoelectronic semiconductor chip 400 was arranged on the chip landing face 210 of the first leadframe section 200. The optoelectronic semiconductor chip 400 can be a light emitting diode chip (LED chip), for example. The optoelectronic semiconductor chip 400 has a first surface 410 and a second surface 420 opposite the first surface 410. The first surface 410 forms a radiation emission face of the optoelectronic semiconductor chip 400.

In the example illustrated, the first surface 410 and the second surface 420 of the optoelectronic semiconductor chip 400 each have an electrical contact face of the optoelectronic semiconductor chip 400. The second surface 420 faces the chip landing face 210 of the first leadframe section 200. The electrical contact face of the optoelectronic semiconductor chip 400 that is arranged at the second surface 420 electrically conductively connects to the chip landing face 210 of the first leadframe section 200. The electrical contact face of the optoelectronic semiconductor chip 400 that is arranged at the first surface 410 of the optoelectronic semiconductor chip 400 electrically conductively connects to the upper face 310 of the second leadframe section 300 by a bond wire 430. Consequently, electrical contact can be made with, and a voltage can be applied to, the optoelectronic semiconductor chip 400 via the soldering contact face 220 of the first leadframe section 200 and the lower face 320 of the second leadframe section 300.

After the process of arranging the optoelectronic semiconductor chip 400 on the chip landing face 210, the cavity 130 of the plastics housing 100 was filled with a potting material 500. In this case, the optoelectronic semiconductor chip 400 arranged in the cavity 130 and the bond wire 430 arranged in the cavity 130 were embedded into the potting material 500. As a result, the potting material 500 brings about a protection of the optoelectronic semiconductor chip 400 and of the bond wire 430 against damage resulting from external mechanical influences.

The potting material 500 preferably comprises silicone. The potting material 500 can be clear silicone that is optically largely transparent to electromagnetic radiation having a wavelength emitted by the optoelectronic semiconductor chip 400. The potting material 500 can additionally comprise embedded particles. By way of example, diffusely scattering particles, for example, $TiO_2$ particles or wavelength converting particles can be embedded into the potting material 500. The potting material 500 then scatters electromagnetic radiation emitted by the optoelectronic semiconductor chip 400 and/or converts wavelengths of electromagnetic radiation emitted by the optoelectronic semiconductor chip 400.

The potting material 500 was introduced into the cavity 130 of the plastics housing 100 in at least partly liquid form. During introduction of the potting material 500 into the cavity 130, part of the potting material 500 crept through the gaps 140 between the material of the plastics housing 100 and the first leadframe section 200 and the second leadframe section 300 to the underside 120 of the plastics housing 100. At the underside 120 of the plastics housing 100, the potting material 500 continued its creeping process along the underside 120 of the plastics housing 100. The creeping process may have been supported by a capillary effect between the underside 120 of the plastics housing 100 and the top side of a carrier on which the plastics housing 100 was arranged.

The potting material 500 advanced along the underside 120 of the plastics housing 100 into the edge region 221 of the soldering contact face 220 of the first leadframe section 200. It is only at the first groove 230 in the soldering contact face 220 of the first leadframe section 200 that the creeping process of the potting material 500 was ended. The capillary forces acting on the potting material 500 were interrupted in the region of the first groove 230.

The potting material 500 then covers the edge region 221 of the soldering contact face 220, but not the central region 222 of the soldering contact face 220 of the first leadframe section 200. Correspondingly, an edge region of the lower face 320 of the second leadframe section 300 was also covered by the potting material 500 as far as the second groove 330 in the lower face 320.

Since a potential creepage path along that side of the second leadframe section 300 which faces away from the first leadframe section 200 is very much longer than the creepage path for the potting material 500 along that side of the second leadframe section 300 which faces the first leadframe section 200, it suffices to form the second groove 330 at that side of the lower face 320 of the second leadframe section 300 which faces the first leadframe section 200. Correspondingly, the first groove 230 also need not necessarily completely enclose the central region 222 of the soldering contact face 220.

The optoelectronic component 10 can be provided for surface mounting by a reflow soldering process. In this case, the soldering contact face 220 and the lower face 320 at the underside 120 of the plastics housing 100 of the optoelectronic component 10 are electrically conductively contacted via soldering connections. Since the soldering contact face 220 and the lower face 320 are substantially not covered by the potting material 500, a good wettability of the soldering contact face 220 and of the lower face 320 with solder is ensured in this case.

If, in an individual case, a covering of the soldering contact face 220 of the first leadframe section 200 and/or of the lower face 320 of the second leadframe section 300 nevertheless occurs during the introduction of the potting material 500 into the cavity 130, then said covering can easily be detected in a visual inspection in the region of the first groove 230 and/or the second groove 330.

Our components and methods have been illustrated and described in greater detail on the basis of the preferred examples. Nevertheless, this disclosure is not restricted to the examples disclosed. Rather, other variations can be derived therefrom by those skilled in the art, without departing from the scope of protection of the appended claims.

The invention claimed is:

1. An optoelectronic component comprising:
   a plastics housing,
   wherein a first leadframe section is embedded into the plastics housing,
   a chip landing face and a soldering contact face of the first leadframe section are at least partly not covered by the plastics housing,
   the soldering contact face has a groove,
   the groove is not covered by the material of the plastics housing, and
   the groove extends circumferentially around a central region of the soldering contact face at least in sections.

2. The optoelectronic component as claimed in claim 1, wherein the groove is arranged in an edge region of the soldering contact face.

3. The optoelectronic component as claimed in 1, wherein the groove has a depth of 10 μm to 1 mm.

4. The optoelectronic component as claimed in 1, wherein an optoelectronic semiconductor chip is arranged on the chip landing face.

5. The optoelectronic component as claimed in 1,
   wherein the plastics housing has a cavity adjoining the chip landing face, and
   a potting material is arranged in the cavity.

6. The optoelectronic component as claimed in 5, wherein the potting material comprises silicone.

7. The optoelectronic component as claimed in 1,
   wherein a second leadframe section is embedded into the plastics housing, and
   an upper face and a lower face of the second leadframe section are at least partly not covered by the plastics housing.

8. The optoelectronic component as claimed in claim 7, wherein the lower face has a further groove.

9. An optoelectronic component comprising:
   a plastics housing,
   wherein a first leadframe section is embedded into the plastics housing,
   a chip landing face and a soldering contact face of the first leadframe section are at least partly not covered by the plastics housing,
   the soldering contact face has a groove,
   the groove is not covered by the material of the plastics housing, the plastics housing has a cavity adjoining the chip landing face, a potting material is arranged in the cavity, the groove extends circumferentially around a central region of the soldering contact face at least in sections, and the groove prevents wetting of the central region by the potting material.

10. The optoelectronic component as claimed in claim 9, wherein the groove is arranged in an edge region of the soldering contact face.

11. The optoelectronic component as claimed in 9, wherein the groove has a depth of 10 µm to 1 mm.

12. The optoelectronic component as claimed in 9, wherein an optoelectronic semiconductor chip is arranged on the chip landing face.

13. The optoelectronic component as claimed in 9, wherein the plastics housing has a cavity adjoining the chip landing face, and a potting material is arranged in the cavity.

14. The optoelectronic component as claimed in 13, wherein the potting material comprises silicone.

15. The optoelectronic component as claimed in 9, wherein a second leadframe section is embedded into the plastics housing, and an upper face and a lower face of the second leadframe section are at least partly not covered by the plastics housing.

16. The optoelectronic component as claimed in claim 15, wherein the lower face has a further groove.

* * * * *